United States Patent
Otremba et al.

(10) Patent No.: US 9,754,854 B2
(45) Date of Patent: Sep. 5, 2017

(54) SEMICONDUCTOR DEVICE HAVING SENSING FUNCTIONALITY

(71) Applicant: Infineon Technologies AG

(72) Inventors: Ralf Otremba, Kaufbeuren (DE); Marco Seibt, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 216 days.

(21) Appl. No.: 13/650,023

(22) Filed: Oct. 11, 2012

(65) Prior Publication Data

US 2014/0103902 A1    Apr. 17, 2014

(51) Int. Cl.
*H01L 23/34* (2006.01)
*H01L 23/495* (2006.01)
(Continued)

(52) U.S. Cl.
CPC ........ *H01L 23/34* (2013.01); *H01L 23/49524* (2013.01); *H01L 23/49562* (2013.01); *H01L 23/3107* (2013.01); *H01L 23/49568* (2013.01); *H01L 24/73* (2013.01); *H01L 25/072* (2013.01); *H01L 25/18* (2013.01); *H01L 2224/32225* (2013.01); *H01L 2224/32245* (2013.01); *H01L 2224/40137* (2013.01); *H01L 2224/40247* (2013.01); *H01L 2224/48137* (2013.01); *H01L 2224/48139* (2013.01);
(Continued)

(58) Field of Classification Search
CPC ........ H01L 25/16; H01L 25/07; H01L 23/62; H01L 23/48; H01L 25/07; H01L 25/18; H01L 25/072; H01L 23/49524; H01L 23/34; H01L 23/49562; H01L 23/49568; H01L 23/3107; H01L 2924/00; H01L 2924/13055; H01L 2924/1305; H01L 2924/13062; H01L 2924/13091; H01L 2924/3225; H01L 2924/48247; H01L 2924/00012; H01L 2224/73265; H01L 2224/73263; H01L 2224/48247; H01L 2224/40137; H01L 2224/32245; H01L 2224/48137; H01L 2224/32225; H01L 2224/40247
USPC ........ 324/76.11; 257/48, 735, 778, E23.014, 257/E23.002, E23.179; 374/178
See application file for complete search history.

(56) References Cited

U.S. PATENT DOCUMENTS 5,170,312 A * 12/1992 Davies .................... H01L 24/49
                                                           327/565
5,451,806 A    9/1995 Davies
(Continued)

FOREIGN PATENT DOCUMENTS

DE          226964 A1      9/1985
EP        1079434 A2 *     2/2001

*Primary Examiner* — Farhana Hoque
*Assistant Examiner* — Felicia Farrow
(74) *Attorney, Agent, or Firm* — Slater Matsil, LLP (57) ABSTRACT

A semiconductor package includes a power semiconductor chip having a control electrode, a first load electrode and a second load electrode. The package also includes a first terminal conductor electrically coupled to the control electrode, a second terminal conductor electrically coupled to the first load electrode and a third terminal conductor electrically coupled to the second load electrode. Further, the package includes a temperature sensor electrically coupled to at least two of the first, second and third terminal conductor.

15 Claims, 5 Drawing Sheets

(51) Int. Cl.
*H01L 23/31* (2006.01)
*H01L 25/07* (2006.01)
*H01L 25/18* (2006.01)
*H01L 23/00* (2006.01)

(52) U.S. Cl.
CPC .............. *H01L 2224/48247* (2013.01); *H01L 2224/73263* (2013.01); *H01L 2224/73265* (2013.01); *H01L 2924/1305* (2013.01); *H01L 2924/13055* (2013.01); *H01L 2924/13062* (2013.01); *H01L 2924/13091* (2013.01)

(56) References Cited

U.S. PATENT DOCUMENTS

| | | | |
|---|---|---|---|
| 5,786,973 A * | 7/1998 | Majumdar | H02H 7/1206 307/86 |
| 5,904,499 A * | 5/1999 | Pace | 438/108 |
| 2001/0015676 A1* | 8/2001 | Takikawa et al. | 330/307 |
| 2009/0140369 A1* | 6/2009 | Lee | 257/467 |
| 2009/0212284 A1 | 8/2009 | Otremba et al. | |
| 2010/0321092 A1* | 12/2010 | Momota | H01L 29/0696 327/512 |
| 2011/0304364 A1* | 12/2011 | Yoo et al. | 327/147 |
| 2012/0020419 A1* | 1/2012 | Kaeriyama | 375/259 |
| 2012/0297263 A1* | 11/2012 | Taya | 714/733 |
| 2012/0313612 A1* | 12/2012 | Schneider et al. | 323/311 |
| 2013/0264610 A1* | 10/2013 | Chen et al. | 257/252 |

* cited by examiner

| Modulating a sensing signal on a control signal supplied to a control terminal lead of a semiconductor package or on a load signal supplied to a load terminal lead of a semiconductor package, the sensing signal having a frequency higher than a frequency of the control signal or a frequency of the load signal, respectively |

↓

| Evaluating a load signal output at a load terminal lead of the semiconductor package by demodulating a load signal contribution responsive to the sensing signal |

SEMICONDUCTOR DEVICE HAVING SENSING FUNCTIONALITY

TECHNICAL FIELD

The invention relates to the technique of packaging, and in particular to the technique of packaging a semiconductor chip and sensing operation quantities thereof.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. Subsequently, the semiconductor chips may be mounted on electrically conductive carriers, such as leadframes. In many cases, it is desired to monitor the operation or performance of the semiconductor chip. Packaging methods providing small component sizes at low expenses and with the possibility to monitor the devices' operation are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

In the following embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. The following description is therefore not to be taken in a limiting sense, and the scope of the invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements. However, the disclosure shall optionally also comprise that such elements are directly connected or coupled together without intervening elements provided in between.

Devices containing power semiconductor chips are described herein. In particular, one or more power semiconductor chips having a vertical structure may be involved, that is to say that the power semiconductor chips may be fabricated in such a way that electric currents can flow in a direction perpendicular to the main surfaces of the power semiconductor chips. A power semiconductor chip having a vertical structure has electrodes on its two main surfaces, that is to say on its top side and bottom side.

Power semiconductor chips, in particular vertical power semiconductor chips, may e.g., be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main surface, while the drain electrode of the power MOSFET is arranged on the other main surface. The semiconductor chips need not be manufactured from specific semiconductor material, for example, Si, SiC, SiGe, GaAs, and, furthermore, may contain inorganic and/or organic materials that are not semiconductors. The semiconductor chips may be of different types and may be manufactured by different technologies.

The power semiconductor chip(s) may be mounted on a carrier. The carrier may be of any shape, size or material. In one embodiment, the carrier may be a metal plate or sheet such as, e.g., a die pad of a leadframe. The metal plate or sheet may be of any metal or metal alloy, e.g., copper or copper alloy. In other embodiments, the chip carrier may be made of plastics or ceramics. For instance, the chip carrier may comprise a layer of plastics coated with a metal layer. By way of example, such chip carrier may be a single-layer PCB or a multi-layer PCB. The PCB may have at least one insulating layer and a structured metal foil layer attached to the insulating layer. In other embodiments, the chip carrier may comprise a plate of ceramics coated with a metal layer. By way of example, such chip carrier may be a DCB (direct copper bonded) ceramics substrate.

The power packages described below include external contact elements also referred to as terminal conductors herein. The terminal conductors may be of any shape and size. The terminal conductors are accessible from the outside of the package and may thus allow electrical contact to be made with the power semiconductor chip(s) from outside the package. Furthermore, the terminal conductors may be thermally conductive and may serve as heat sinks for dissipating the heat generated by the semiconductor chips. The terminal conductors (i.e., external contact elements) may be composed of any desired electrically conductive material, for example of a metal, such as copper, aluminum or gold, a metal alloy or an electrically conductive organic material. The power package may be a leaded or leadless package. The terminal conductors may be the leads of a leaded package or the externally exposed conductors of a leadless package. In particular, the terminal conductors may be the leads or externally exposed conductors of a leadframe.

The (packaged) power semiconductor chip(s) may at least partly be surrounded or embedded in at least one electrically insulating material. The electrically insulating material may form an encapsulation body. The encapsulation body may comprise or be made of a mold material. Various techniques may be employed to form the encapsulation body of the mold material, for example compression molding, injection molding, powder molding or liquid molding. Further, the encapsulation body may have the shape of a piece of a layer, e.g., a piece of a sheet or foil that is laminated on top of the power semiconductor chip(s) and the carrier(s). The encapsulation body may form part of the periphery of the package, i.e., may at least partly define the shape of the semiconductor device.

The electrically insulating material may comprise or be made of a thermoset material or a thermoplastic material. A thermoset material may e.g., be made on the basis of an epoxy resin. A thermoplastic material may e.g. comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release.

The electrically insulating material forming the encapsulation body may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

Figure 1:
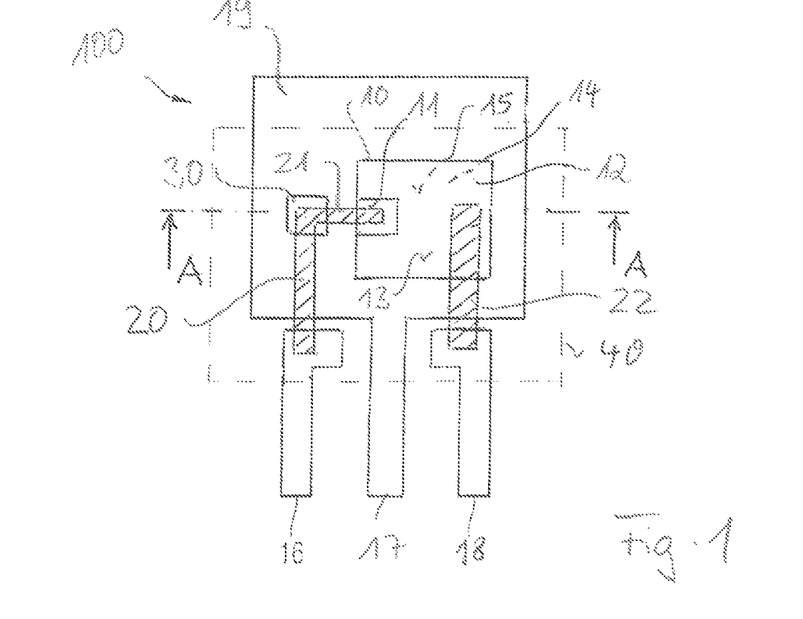
FIG. 1 schematically illustrates a top view of a semiconductor package 100 in accordance with exemplary embodiments.

FIG. 1 schematically illustrates a semiconductor package 100 including a semiconductor chip 10 having a control electrode 11 and a first load electrode 12 located e.g., on a first surface 13 and a second load electrode 14 located e.g., on a second surface 15 opposite to the first surface 13. Since FIG. 1 shows a top view of the semiconductor package 100, the second load electrode 14 and the second surface 15 of the semiconductor chip 10 are not visible.

Further, the semiconductor package 100 includes a first terminal lead 16 electrically coupled to the control electrode 11, a second terminal lead 17 electrically coupled to the second load electrode 14, and a third terminal lead 18 electrically coupled to the first load electrode 12. As is depicted in FIG. 1, the second terminal lead 17 may be arranged between the first and third terminal leads 16 and 18.

The semiconductor chip 10 may be mounted on a carrier 19. The carrier 19 may comprise or be made of a flat metal plate, e.g., a die pad of a leadframe. In other embodiments the carrier 19 may comprise or be made of a plastic plate or a ceramic substrate coated by a metal layer on the upper surface thereof. If the semiconductor chip has a vertical structure, the second load electrode 14 may be electrically coupled to the carrier 19. As shown in FIG. 1, the second lead terminal 17 may be electrically coupled to the carrier 19.

The semiconductor chip 10 may be configured as a power transistor, for example, a power MOSFET, IGBT, JFET or power bipolar transistor. In the case of a power MOSFET or a JFET, the first load electrode 12 is a source electrode, the second load electrode 14 is a drain electrode, and the control electrode 11 is a gate electrode. In the case of an IGBT, the first load electrode 12 is an emitter electrode, the second load electrode 14 is a collector electrode, and the control electrode 11 is a gate electrode. In the case of a power bipolar transistor, the first load electrode 12 is an emitter electrode, the second load electrode 14 is a collector electrode, and the control electrode 11 is a base electrode.

During operation, voltages higher than 5, 50, 100, 500 or 1000 V may be applied between the first and second load electrodes 12, 14. The switching frequency applied to the control electrode 11 may be in the range from 1 kHz to 100 MHz, but may also be outside of this range.

The semiconductor package 100 may comprise a temperature sensor 30. The temperature sensor 30 may e.g., be a diode. As exemplified in FIG. 1, the temperature sensor 30 may be external to the semiconductor chip 10. The temperature sensor 30 may be part of the package.

A first conductor 20 may electrically connect the first terminal lead 16 to a first electrode of the temperature sensor 30. A second conductor 21 may electrically connect the first electrode of the temperature sensor 30 to the control electrode 11 of the semiconductor chip 10. A second electrode of the temperature sensor 30 may be electrically connected to the second terminal lead 17 through, e.g., the carrier 19. A third conductor 22 may electrically connect the third terminal lead 18 to the first load electrode 12 of the semiconductor chip 10. In general, the temperature sensor 30 is electrically coupled to at least two of the first, second and third terminal leads 16, 17, 18.

The semiconductor package 100 may comprise an encapsulation body 40. The encapsulation body 40 may embed partly or completely the carrier 19, the semiconductor chip 10, the temperature sensor 30 and the first, second and third conductors 20, 21, 23. In particular, the first, second and third conductors 20, 21, 23 may e.g., be completely embedded in the encapsulation body 40, i.e., they may not be exposed at the encapsulation body 40 to form terminals of the semiconductor package 100. Further, by way of example, the semiconductor chip 10 may be completely embedded by the encapsulation body 40 at its side and top faces. The first, second and third terminal leads 16, 17, 18 protrude out of the encapsulation body 40 and thus form external contact elements of the semiconductor package 100.

Figure 2:
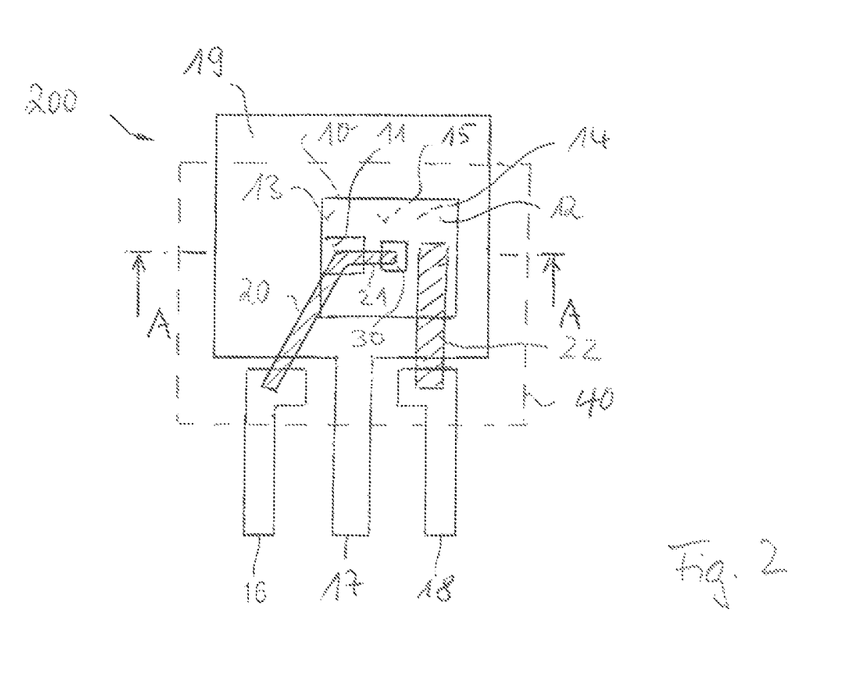
FIG. 2 schematically illustrates a top view of a semiconductor package 200 in accordance with exemplary embodiments.

FIG. 2 schematically illustrates a semiconductor package 200 including components similar or identical to the components of the semiconductor package 100. Therefore similar or identical components of the semiconductor packages 100 and 200 are denoted by the same reference numerals. Thus, in order to avoid reiteration, reference is made to the above disclosure to semiconductor package 100.

In the semiconductor package 200 the temperature sensor 30 integrated in the semiconductor chip 10. By way of example, similar as in FIG. 1, the temperature sensor 30 may be a diode connected between the first terminal lead 16 and the second terminal lead 17, which, in particular, is connected to carrier 19.

Figure 3:
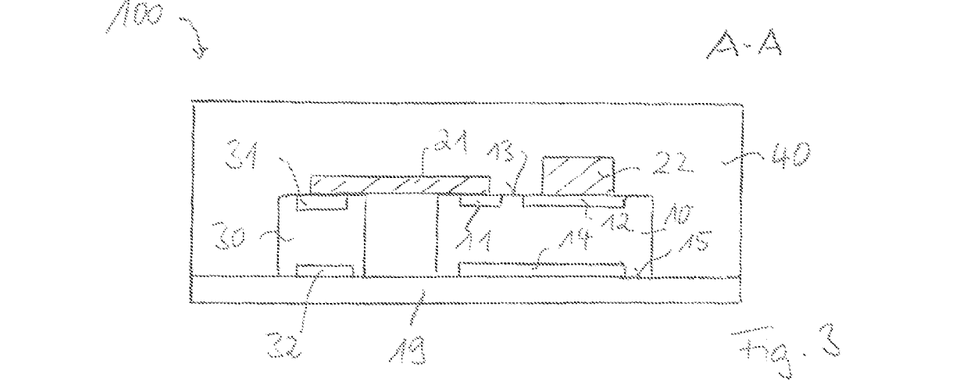
FIG. 3 schematically illustrates a cross-sectional view of the semiconductor package 100 shown in FIG. 1 along line A-A.

FIG. 3 illustrates a cross-sectional view of the semiconductor package 100 along line A-A. As apparent from FIG. 3, the temperature sensor 30 is external to the semiconductor chip 10. The first electrode of the temperature sensor 30 is denoted by reference numeral 31 and the second electrode of the temperature sensor 30 is denoted by reference numeral 32. By way of example, the temperature sensor 30 may be a diode. Reference numeral 31 may then designate an anode of the diode and reference numeral 32 may designate a cathode of the diode.

As illustrated in FIG. 3, the temperature sensor 30 and the semiconductor chip 10 may be completely embedded in the encapsulation body 40. In other examples, the encapsulation body 40 may have a through-hole (not shown) connecting the top of the encapsulation body 40 to the third conductor 22. A heat sink (not shown) arranged at the top of the encapsulation body 40 may be thermally coupled to the third conductor 22 via the through-hole. The third conductor 22 may be a contact clip or one or more bonding wires capable of carrying a current as specified for the power semiconductor package.

Figure 4:
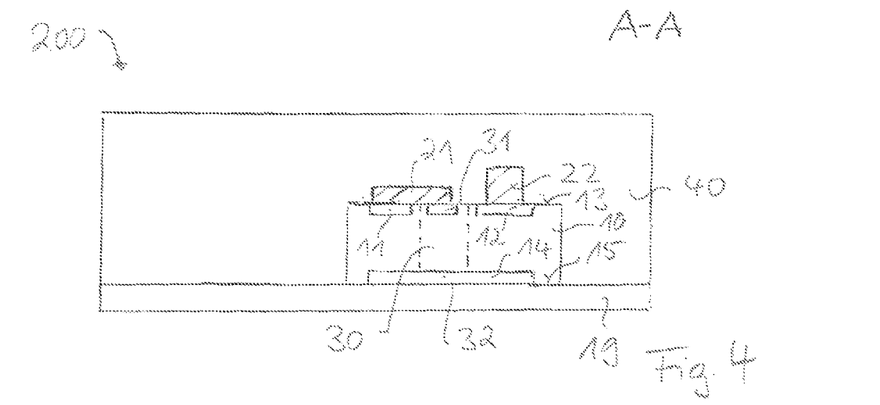
FIG. 4 schematically illustrates a cross-sectional view of the semiconductor package 200 shown in FIG. 2 along line A-A.

FIG. 4 illustrates a cross-sectional view of the semiconductor package 200 of FIG. 2 along line A-A. Again, in order to avoid reiteration, reference is made to the description above. In semiconductor package 200 the temperature sensor 30 is integrated in the semiconductor chip 10. By way of example, the temperature sensor 30 may be a diode. In that case upper electrode 31, connected to second conductor 21, may be the anode of the diode, and bottom electrode 32, which may be coupled to second load electrode 14 of the semiconductor chip 10, may be the cathode of the diode.

Figure 5:
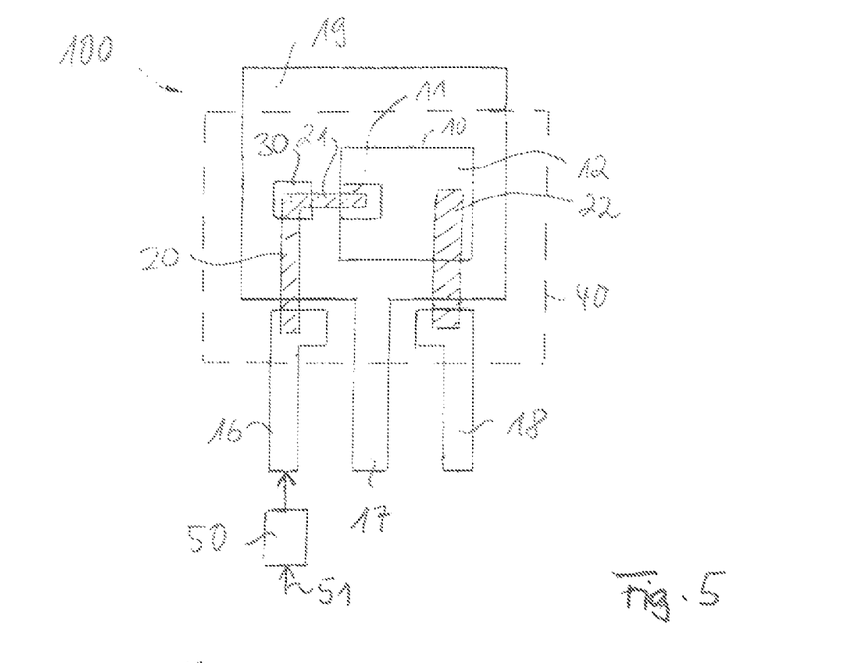
FIG. 5 schematically illustrates a top view of a semiconductor package 100 connected to a modulation unit in accordance with exemplary embodiments.

Referring to FIG. 5, a modulation unit 50 may be electrically coupled to the first terminal lead 16. The modulation unit 50 is configured to modulate a sensing signal on a control signal 51 supplied to the first terminal lead 16.

The sensing signal modulated on the control signal 51 may have a frequency higher than the frequency of the control signal 51.

Figure 6:
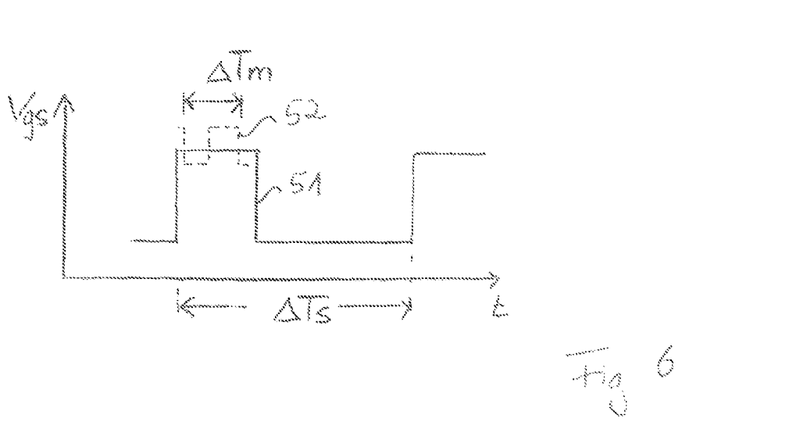
FIG. 6 is a graph schematically illustration the modulation of a voltage sensing signal on a voltage control signal.

By way of example, referring to FIG. 6, the control signal 51 is the voltage Vgs between the control electrode 11 (e.g., gate electrode) and the first load electrode 12 (e.g., source electrode). Vgs controls the switching operation of the semiconductor chip 10. The switching period $\Delta T_s$ of the control signal 51 may be in the range of e.g., 1 ms to 10 µs.

Reference numeral 52 designates the sensing signal 52 modulated on the control signal 51. The sensing signal 52 may be a periodic signal. In FIG. 6, the sensing signal is a voltage signal. The frequency of the sensing signal 52 may e.g., be ten to hundred or even thousand times higher than the frequency of the control signal 51. Thus, the modulation period $\Delta T_m$ may be in the range between 100 µs to 10 or even 1 ns. The amplitude of the sensing signal 52 may be significantly smaller than the amplitude of the control signal 51. By way of example, the amplitude of the sensing signal 52 may be more than five, ten or even hundred times smaller than the (voltage) amplitude of the control signal 51 used to initiate the switching operation of the power semiconductor chip 10.

The conductivity of the temperature sensor 30 depends on its temperature. Thus, the current flowing through the second and third terminal leads 17, 18 do not only depend on the switching operation of the semiconductor chip 10 but also on the instant temperature of the temperature sensor 30. Similarly, the voltage at the exposed end of the third terminal lead 18 is dependent from the temperature of the temperature sensor 30, since the temperature of temperature sensor 30 effects the voltage between the control electrode 11 and the second load electrode 14 (e.g., the gate-drain voltage). More specifically, the higher the temperature at of the temperature sensor 30, the lower is the voltage between the control electrode 11 and the first electrode 12. This causes the semiconductor chip 10 to be driven nearer to the cutoff region.

This effect may be sensed by demodulating the voltage measured e.g., at the (exposed end of the) third terminal lead 18 using the modulation frequency of the sensing signal 52 which is superimposed on the control signal 51. That way, the temperature of the temperature sensor 30 may be evaluated without the need to add a further terminal lead (or pin) to the package 100 for temperature sensing purposes. In other words, the sensing function may be implemented without increasing the number of terminal leads (pins) of the package 100.

The sensing signal modulation technique in order to derive temperature information has been illustrated in FIG. 5 for the example of semiconductor package 100 of FIG. 1. Without saying, the same technique may be applied to semiconductor package 200 of FIG. 2. Thus, in order to avoid reiteration, the above disclosure to semiconductor package 100 is similarly applicable to semiconductor package 200 as illustrated in FIG. 2.

Figure 7:
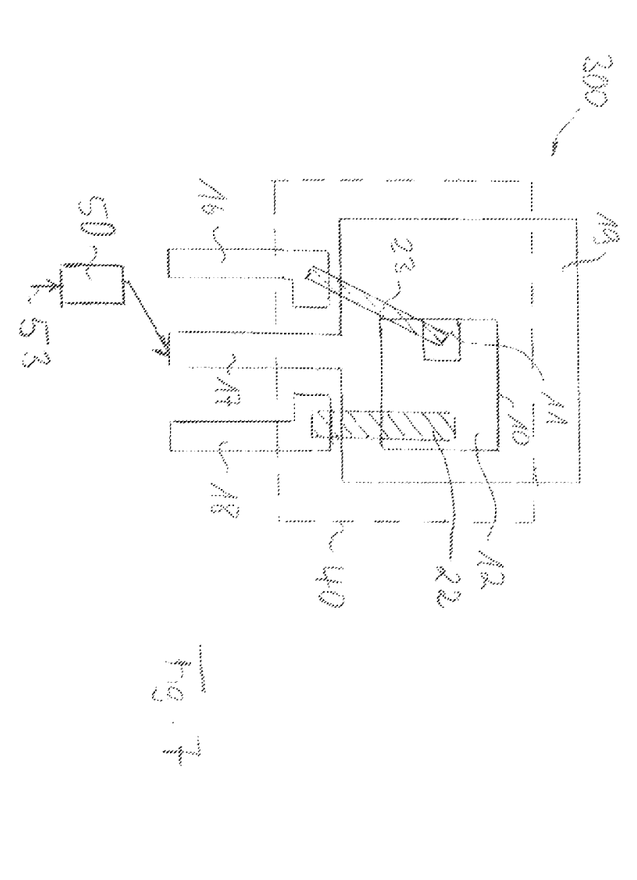
FIG. 7 schematically illustrates a top view of a semiconductor package 300 connected to a modulation unit in accordance with exemplary embodiments.

Further, the technique of superimposing or modulating a voltage sensing signal on a control signal 51 to obtain sensing information may be generalized to a technique of modulating or superimposing a current sensing signal to a load signal 53 to obtain sensing information without additional terminal leads (pins) necessary. A corresponding example is illustrated in FIG. 7. Here, the modulation unit 50 is coupled to a load electrode of the semiconductor chip 10, e.g., to second load electrode 14 via e.g., second terminal lead 17 and e.g., carrier 19.

Figure 8:
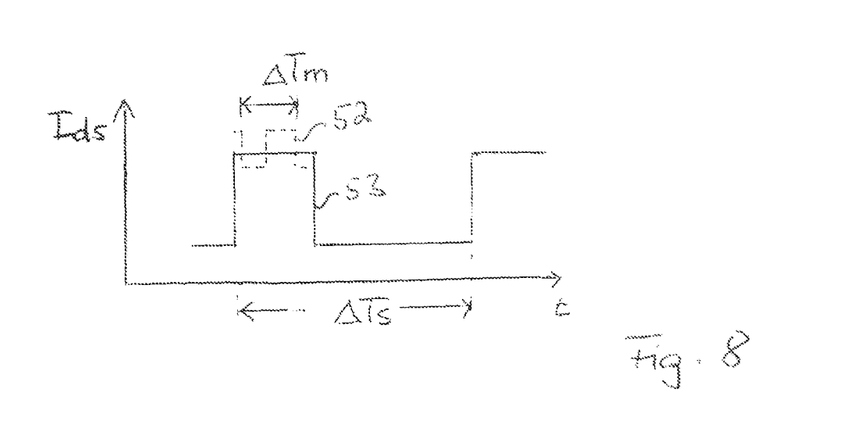
FIG. 8 is a graph schematically illustration the modulation of a current sensing signal on a current supplied to a load terminal of a package.

Referring to FIG. 8, the load signal 53 may be given by a current flowing e.g., through the second terminal lead 17 (e.g., the drain-source current Ids). This current signal 53 is modulated by superimposing a current sensing signal 52 of higher frequency and smaller amplitude as shown in FIG. 8. The disclosure to FIG. 7 (referring to voltage modulation) analogously applies to FIG. 8 illustrating a current modulation, and reference is made to FIG. 7 in order to avoid reiteration of modulation frequencies, switching frequencies, amplitude ratios etc.

Returning to FIG. 7, the modulation unit 50 may operate in a similar fashion as the modulation unit 50 in FIG. 5, however, with the exception that the sensing signal 52 superimposed on the load signal 53 is a current signal rather than a voltage signal. Thus, if modulation unit 50 is used to provide a modulated load signal to package 100 or 200, the evaluation of the temperature may be similar as explained above with reference to FIG. 5.

Still further, the technique of superimposing or modulating a voltage or current sensing signal 52 on a control signal 51 or load signal 53 may be generalized to obtain sensing information about other and/or additional quantities than temperature without additional terminal leads (pins) necessary. In FIG. 7, by way of example, another sensing quantity rather than temperature shall be evaluated. Thus, semiconductor package 300 may not have a temperature sensor. Rather, the first terminal lead 16 may be directly coupled to the control electrode 11 via a fourth conductor 23. Here, the techniques described above may be applicable for obtaining information on other sensing quantities such as, e.g., the voltage at the first load electrode 12. It is to be noted that the voltage at the first load electrode 12 is different from the voltage at the end of the third terminal lead 18 because of an (unknown) voltage drop occurring between the first load electrode 12 and the end of the third terminal lead 18. For that reason, conventional power packages are sometimes equipped with an additional (fourth) terminal lead to sense the voltage at the first load electrode 12.

Figure 9:
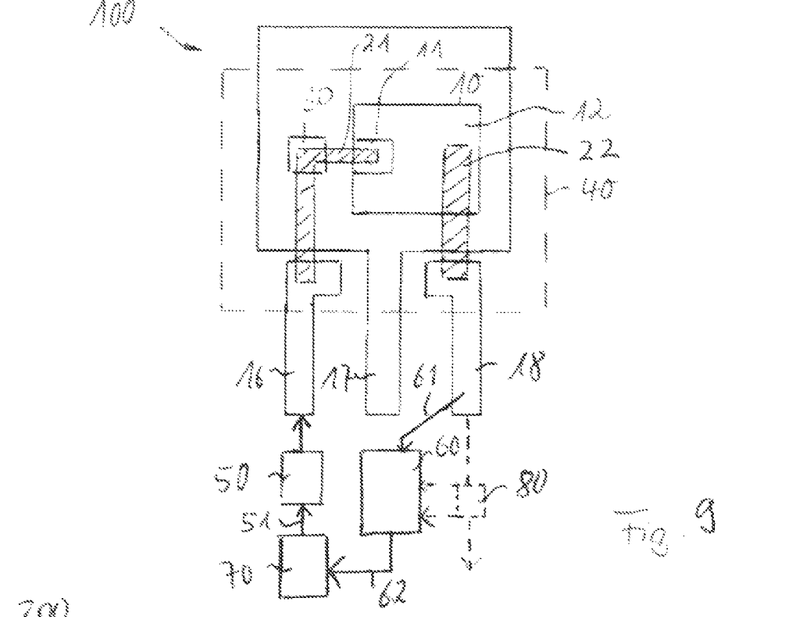
FIG. 9 schematically illustrates a top view of a semiconductor package 100 connected to a modulation unit an evaluation unit and a control unit in accordance with exemplary embodiments.

FIG. 9 illustrates a device comprising a semiconductor package as, e.g., exemplified by semiconductor package 100, a control unit 70 to generate the control signal 51, a modulation unit 50 to modulate a sensing signal 52 on the control signal as described above and an evaluation unit 60 to evaluate the sensing quantity such as, e.g., a temperature or a voltage of a chip electrode such as, e.g., the first load electrode 12. The evaluation unit 60 is electrically coupled via line 61 to the exposed end of the third terminal lead 18. The evaluation unit 60 may output an evaluation signal 62 indicative of the evaluation result (e.g., a temperature or an electrode voltage). The evaluation signal 62 may be fed into the control unit 70. The control unit 70 may operate as a regulator using the evaluation signal 62 as a feedback information. That is, the control signal 51 may be varied based on the evaluation signal 62.

By way of example, if a voltage sensing signal 52 is used to apply a voltage modulation to the first terminal lead 16 as shown in FIG. 9, the evaluation unit 60 may be configured to evaluate a voltage input, e.g., the voltage at the third terminal lead 18 obtained via line 61 in order to e.g., derive a temperature information. The voltage swing at the third terminal lead may be responsive to the temperature and is demodulated using e.g., a high pass filter or the modulation frequency of modulator 50 applied for demodulation. The evaluation signal 62 is then indicative of the temperature. The control unit 70 may vary the control signal 51 in accordance with the temperature. That way, by way of example, an overload protection may be implemented.

Further to FIG. 9, a shunt resistor 80 may optionally be connected in series with the third terminal lead 18. The voltage drop across the shunt resistor 80 may be fed to the evaluation unit 60. This voltage drop may be demodulated using e.g., a high pass filter or the modulation frequency applied in the modulation unit 50. That way, the current response caused by the voltage sensing signal 52 superimposed on the control signal 51 may also be evaluated. Evaluation of the current response may e.g., be used to derive the voltage at the first load electrode 12. The evaluation signal 62 may then be indicative of the voltage at the first load electrode 12. A feedback of the voltage at the first load electrode 12 allows the control unit 70 to provide a control signal 51 which drives the semiconductor chip 10 more precisely at a desired point of operation. Thus, overall performance may be improved by first load electrode 12 voltage feedback.

It is to be noted that the evaluation signal 62 may also comprise temperature and voltage information in combination. In this case, the control unit 70 is configured to control the control signal 51 in view of temperature and first load electrode voltage information.

It is to be noted that line 61 and the shunt resistor 80 may also be connected to the second terminal lead 17 rather than the third terminal lead 18.

Figure 10:
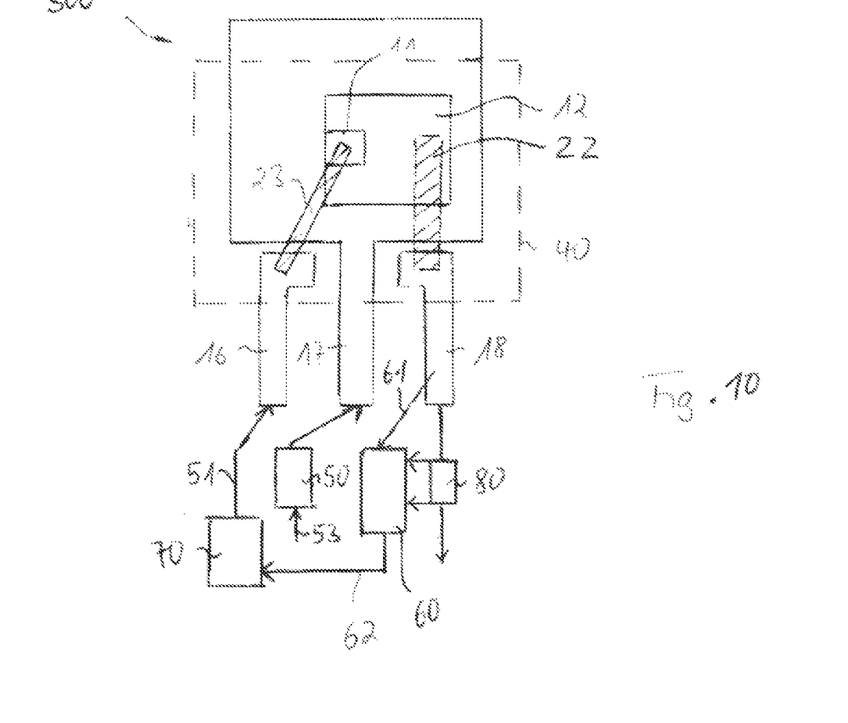
FIG. 10 schematically illustrates a top view of a semiconductor package 300 connected to a modulation unit, an evaluation unit and a control unit in accordance with exemplary embodiments.

FIG. 10 illustrates another example on how to apply the modulation technique for power transistor switching operation optimization. Here, by way of example, package 300 without a temperature sensor is used. The modulation unit 50 performs current modulation as described in conjunction with FIGS. 7 and 8. The evaluation unit 60 may be configured to measure and evaluate the voltage drop across the shunt resistor 80. Further, the evaluation unit 60 may be configured to measure and evaluate the voltage at the third terminal lead 18 as received via line 61.

The evaluation unit 60 outputs an evaluation signal 62 indicative of the voltage at first load electrode 12. Evaluation signal 62 is provided to an input of control unit 70. The control unit 70 varies the control signal 51 based on the voltage information made available by evaluation signal 62.

In general, a plurality of sensing quantities such as temperature and electrode voltage at a load electrode may be obtained by using the sensing signal modulation technique described above. In general, the sensing signal may be a voltage signal or a current signal. The sensing signal may be modulated on a control voltage (e.g., gate voltage) or on a load current signal (e.g., source and/or drain current). Evaluation using demodulation or filtering technique may use a voltage and/or a current measured at a second or third terminal lead 17, 18. A temperature of the power package or of the semiconductor chip 10 and/or a voltage at a load electrode 12, 14 may be evaluated. The sensing signal 52 may be amplitude modulated or frequency modulated. Further, an analog or digital modulated sensing signal 52 may be used.

In all embodiments describe above, the semiconductor package 100, 200, 300 may have (exactly) three terminal leads 16, 17, 18 without additional sensing leads necessary. This allows a customer to keep to a conventional "three pin" circuitry layout of an application board without abandon the functionality of controlling the power semiconductor chip 10 in a temperature and/or electrode voltage feedback mode.

Figure 11:
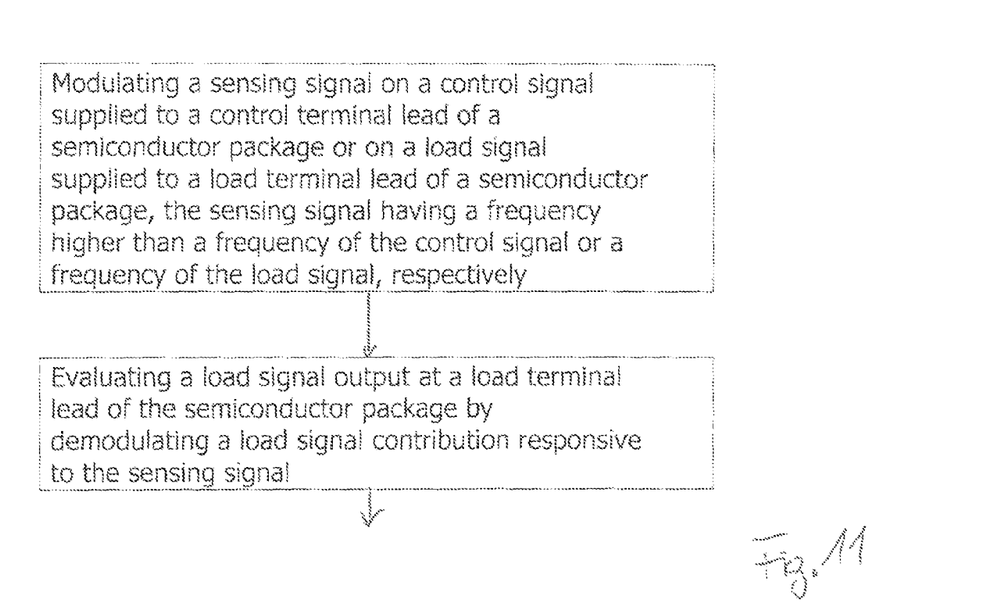
FIG. 11 schematically illustrates an exemplary method of sensing operational quantities of a semiconductor package in accordance with exemplary embodiments.

An exemplary method of sensing operational quantities such as e.g., a temperature of a power semiconductor chip or a power package or an electrode voltage of a power semiconductor chip is described with reference to FIG. 11. At S1, a sensing signal is modulated on a control signal supplied to a control terminal conductor of a semiconductor package or on a load signal supplied to a load terminal conductor of a semiconductor package. The sensing signal may have a frequency higher than a frequency of the control signal or a frequency of the load signal, respectively.

At S2, a load signal output at a load terminal conductor of the semiconductor package is evaluated by demodulating a load signal contribution which is responsive to the sensing signal. Demodulation may e.g., be performed by high pass filtering or by mixing or correlating the demodulated signal with the sensing signal. Thus, a contribution of the output load signal caused by the operational variation of the control signal 51 or load signal 53 may be distinguished from an output load signal contribution caused by the superimposed sensing signal 52.

The method may involve determining a temperature by evaluating the output load signal and/or the method may involve determining an load electrode voltage by evaluating the output load signal. The method is not restricted to determining the temperature and/or load electrode voltage of a power package or power semiconductor chip. As is apparent to a person skilled in the art, depending on the sensor used, other quantities such as e.g., thermal resistances or currents may also be detected using the principles described herein.

Further, the determined quantity may be exploited to improve the control of package operation. To that end, the determined quantity may be fed back to the control unit in order to effect the control signal 51. By way of example, the amplitude, the duty cycle (percentage of on-time to the switching period ΔTs) or the switching period ΔTs may be varied to e.g., regulate the determined quantity (e.g., temperature, electrode voltage) to an optimum value.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package comprising:
    a power semiconductor chip having a control electrode, a first load electrode and a second load electrode, the power semiconductor chip comprising a transistor;
    an encapsulation body encapsulating the power semiconductor chip;
    a first external terminal of the semiconductor package electrically coupled to the control electrode;
    a second external terminal of the semiconductor package electrically coupled to the first load electrode;
    a third external terminal of the semiconductor package electrically coupled to the second load electrode; and
    a temperature sensor directly electrically coupled to at least two of the first, second and third external terminals of the semiconductor package such that the at least two of the first, second and third external terminals of the semiconductor package are directly electrically coupled to both the power semiconductor chip and the temperature sensor,
    wherein the temperature sensor is located within the semiconductor package,
    wherein the temperature sensor comprises a diode, wherein a cathode of the diode is coupled to a drain or collector electrode of the transistor and an anode of the diode is coupled to a gate electrode of the transistor, and
    wherein the first, second and third external terminals are the only external terminals of the semiconductor package that are exposed to an outside of the encapsulation body.

2. The semiconductor package of claim 1, wherein the temperature sensor is directly electrically coupled to the first external terminal and the third external terminal.

3. The semiconductor package of claim 1, wherein the temperature sensor is integrated in the power semiconductor chip.

4. The semiconductor package of claim 1, wherein the temperature sensor is external to the power semiconductor chip.

5. The semiconductor package of claim 1, wherein the transistor of the power semiconductor chip is a power MOSFET or an IGBT.

6. The semiconductor package of claim 1, wherein the first external terminal, the second external terminal and the third external terminal are part of a leadframe.

7. A device comprising:
    a modulation unit; and
    a semiconductor package comprising:
        a power semiconductor chip having a control electrode, a first load electrode and a second load electrode, the power semiconductor chip comprising a transistor;
        a first terminal conductor electrically coupled to the control electrode;
        a second terminal conductor electrically coupled to the first load electrode;
        a third terminal conductor electrically coupled to the second load electrode; and
        an encapsulation body embedding the power semiconductor chip, wherein the first, second and third terminal conductors are exposed to an outside of the encapsulation body to form external terminals of the semiconductor package; and
    a temperature sensor disposed in the semiconductor package, the temperature sensor being electrically coupled to at least two of the first, second and third terminal conductors, wherein the temperature sensor comprises a diode, wherein a cathode of the diode is coupled to a drain or collector electrode of the transistor and an anode of the diode is coupled to a gate electrode of the transistor,
    wherein the modulation unit is electrically coupled to the semiconductor package via at least one of the first terminal conductor, the second terminal conductor and the third terminal conductor, the modulation unit being configured to modulate a sensing signal on a control signal supplied to the first terminal conductor or on a load signal supplied to the second terminal conductor or third terminal conductor, respectively,
    wherein the modulation unit is external to the semiconductor package,
    wherein the control signal is a voltage between the control electrode and the first load electrode, and
    wherein the load signal is a drain-source current.

8. The device of claim 7, wherein the sensing signal has a frequency higher than a frequency of the control signal or a frequency of the load signal, respectively.

9. The device of claim 8, wherein the frequency of the sensing signal is greater than 10 kHz.

10. The device of claim 7, further comprising an evaluation unit electrically coupled to at least one of the second terminal conductor and the third terminal conductor, the evaluation unit being configured to demodulate a load signal contribution responsive to the sensing signal.

11. The device of claim 10, wherein a control unit is electrically coupled to the evaluation unit, and wherein the control signal is based on an evaluation result supplied by the evaluation unit.

12. The device of claim 7, wherein the transistor of the power semiconductor chip is a power MOSFET or an IGBT.

13. The device of claim 7, further comprising an evaluation unit electrically coupled to at least one of the second terminal conductor and the third terminal conductor, the evaluation unit being configured to demodulate a load signal responsive to the sensing signal, wherein the evaluation unit is external to the semiconductor package comprising the power semiconductor chip, the first terminal conductor, the second terminal conductor, the third terminal conductor and the encapsulation body.

14. The device of claim 7, wherein the sensing signal is modulated on the control signal supplied to the first terminal conductor.

15. The device of claim 7, further comprising a shunt resistor external to the semiconductor package, the shunt resistor being electrically coupled to the second or third terminal conductor.

* * * * *